(12) United States Patent
Zhang et al.

(10) Patent No.: US 10,707,755 B1
(45) Date of Patent: Jul. 7, 2020

(54) INTEGRATED CIRCUITS WITH PROGRAMMABLE GATE TIMING SIGNAL GENERATION FOR POWER CONVERTERS AND APPARATUS COMPRISING THE SAME

(71) Applicant: International Business Machines Corporation, Armonk, NY (US)

(72) Inventors: Xin Zhang, Yorktown Heights, NY (US); Todd Edward Takken, Brewster, NY (US); Chung-shiang Wu, Chiba (JP); Robert Matthew Senger, Tarrytown, NY (US); Rudolf Adriaan Haring, Cortlandt Manor, NY (US); Martin Ohmacht, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/257,861

(22) Filed: Jan. 25, 2019

(51) Int. Cl.
*H02M 3/157* (2006.01)
*H01L 27/115* (2017.01)
*H03K 19/0185* (2006.01)
*H03K 19/173* (2006.01)
*H01L 27/112* (2006.01)

(52) U.S. Cl.
CPC ........... *H02M 3/157* (2013.01); *H01L 27/115* (2013.01); *H01L 27/11206* (2013.01); *H03K 19/01855* (2013.01); *H03K 19/1737* (2013.01)

(58) Field of Classification Search
CPC ...... H02M 3/155; H02M 3/156; H02M 3/157; H02M 3/158; H02M 3/1584; H01L 27/11206; H01L 27/115; H01L 27/112; H03K 19/01855; H03K 19/177; H03K 19/1737
See application file for complete search history.

(56) References Cited

U.S. PATENT DOCUMENTS 5,289,021 A 2/1994 El Gamal
5,742,180 A 4/1998 DeHon et al.
(Continued)

OTHER PUBLICATIONS

Imtiaz Hussain and Mohammad Aslam Uqaili "Gate Driver Circuit of Power Electronic Switches with Reduced Number of Isolated DC/DC Converter for a Switched Reluctance Motor" Jun. 2012.
(Continued)

*Primary Examiner* — Adolf D Berhane
(74) *Attorney, Agent, or Firm* — Harrington & Smith (57) ABSTRACT

An apparatus is disclosed that includes a semiconductor device to control a power converter having two or more power FETs. The semiconductor device includes a gate signal generator configured to produce two or more gate signals able to drive the two or more FETs. The gate signal generator has programmable timing configuration parameters to control operation of the two or more gate signals, wherein the timing configuration parameters are digitally programmed via a memory in the semiconductor device. The memory may be implemented with fuses, other non-volatile memory or volatile memory. The parameters may be fixed or updated during a lifetime of the apparatus. A serial-to-parallel conversion may be used to input the parameters. Optimization methods may be performed to determine parameters considered to be optimal. The apparatus may also include the power converter.

20 Claims, 7 Drawing Sheets

(56) References Cited

U.S. PATENT DOCUMENTS

| | | | |
|---|---|---|---|
| 7,002,328 B2 | 2/2006 | Kernahan et al. | |
| 7,190,210 B2 | 3/2007 | Azrai et al. | |
| 7,277,304 B2 | 10/2007 | Stancu et al. | |
| 7,388,420 B2 * | 6/2008 | Diorio | G11C 7/20 327/208 |
| 8,593,075 B1 * | 11/2013 | Melanson | H05B 33/0815 315/224 |
| 8,692,535 B1 * | 4/2014 | Sreenivas | H02M 3/156 323/285 |
| 9,307,623 B1 * | 4/2016 | Mays, II | H05B 41/2828 |
| 2004/0046535 A1 * | 3/2004 | Duffy | H02M 3/157 323/283 |
| 2015/0145486 A1 * | 5/2015 | Bizjak | H02M 3/04 323/234 |
| 2017/0025950 A1 * | 1/2017 | Wu | H02M 3/158 |
| 2018/0138902 A1 | 5/2018 | Lu et al. | |
| 2019/0104583 A1 * | 4/2019 | Konishi | H05B 33/0815 |
| 2019/0200423 A1 * | 6/2019 | Shteynberg | H05B 33/083 |

OTHER PUBLICATIONS

Andras Tantos "H-bridge Control" http://www.modularcircuits.com/blog [retrieved Jan. 2019].

PWM Generator (3-Level)—Generate pulses for PWM-controlled three-level converter. Mathworks. https://www.mathworks.com/help/physmod/sps/powersys/ref/pwmgenerator3level.htlm [retrieved Jan. 2019].

\* cited by examiner

INTEGRATED CIRCUITS WITH PROGRAMMABLE GATE TIMING SIGNAL GENERATION FOR POWER CONVERTERS AND APPARATUS COMPRISING THE SAME

GOVERNMENT RIGHTS

This invention was made with Government support under Contract No.: B621073, which is a subcontract between Lawrence Livermore National Security LLC (LLNS) and International Business Machines Corporation, where LLNS is acting under its prime contract DE-AC52-07NA27344 with the US Government, as awarded by the Department of Energy National Nuclear Security Administration (DOE/NNSA). The Government has certain rights in this invention.

BACKGROUND

This invention relates generally to power converters and, more specifically, relates to signal generation for power converters and use thereof.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Power converters, especially switch-mode power converters, normally require switching of field effect transistors (FETs) to perform voltage conversion. The switching of FETs is controlled by gate signals of the FETs, which are generated from gate timing signal. Depending on topology, a power converter may need two or more gate signals so that the converter can work. The existing products normally provide only two gate signals from a single input signal, which is typically a pulse-width modulation (PWM) clock signal. Some of the existing products use an external voltage source, R (resistance) and C (capacitance), and an on-chip window comparator to control the timing of the gate signals. These methods have insufficient number of gate signals or have insufficient programmability or both.

SUMMARY

This section is meant to be exemplary and not meant to be limiting.

An apparatus is disclosed that includes a semiconductor device to control a power converter having two or more power field effect transistors (FETs). The semiconductor device includes a gate signal generator configured to produce two or more gate signals able to drive the two or more FETs. The gate signal generator has programmable timing configuration parameters to control operation of the two or more gate signals, wherein the timing configuration parameters are digitally programmed via a memory in the semiconductor device. The memory may be implemented with fuses, other non-volatile memory or volatile memory. The parameters may be fixed or updated during a lifetime of the apparatus. A serial-to-parallel conversion may be used to input the parameters. Optimization methods may be performed to determine parameters considered to be optimal. The apparatus may also include the power converter.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As described above, certain methods either have insufficient number of gate signals or have insufficient programmability. The proposed exemplary embodiments herein can control the timing of more than two gate signals, e.g., using a single pulse-width modulation (PWM) clock signal. Exemplary embodiments may also propose how the timing configuration parameters should be stored and used to control gate timing signals. The exemplary embodiments may also propose optimization methods to determine timing parameters which are optimal for the power converter.

Figure 1:
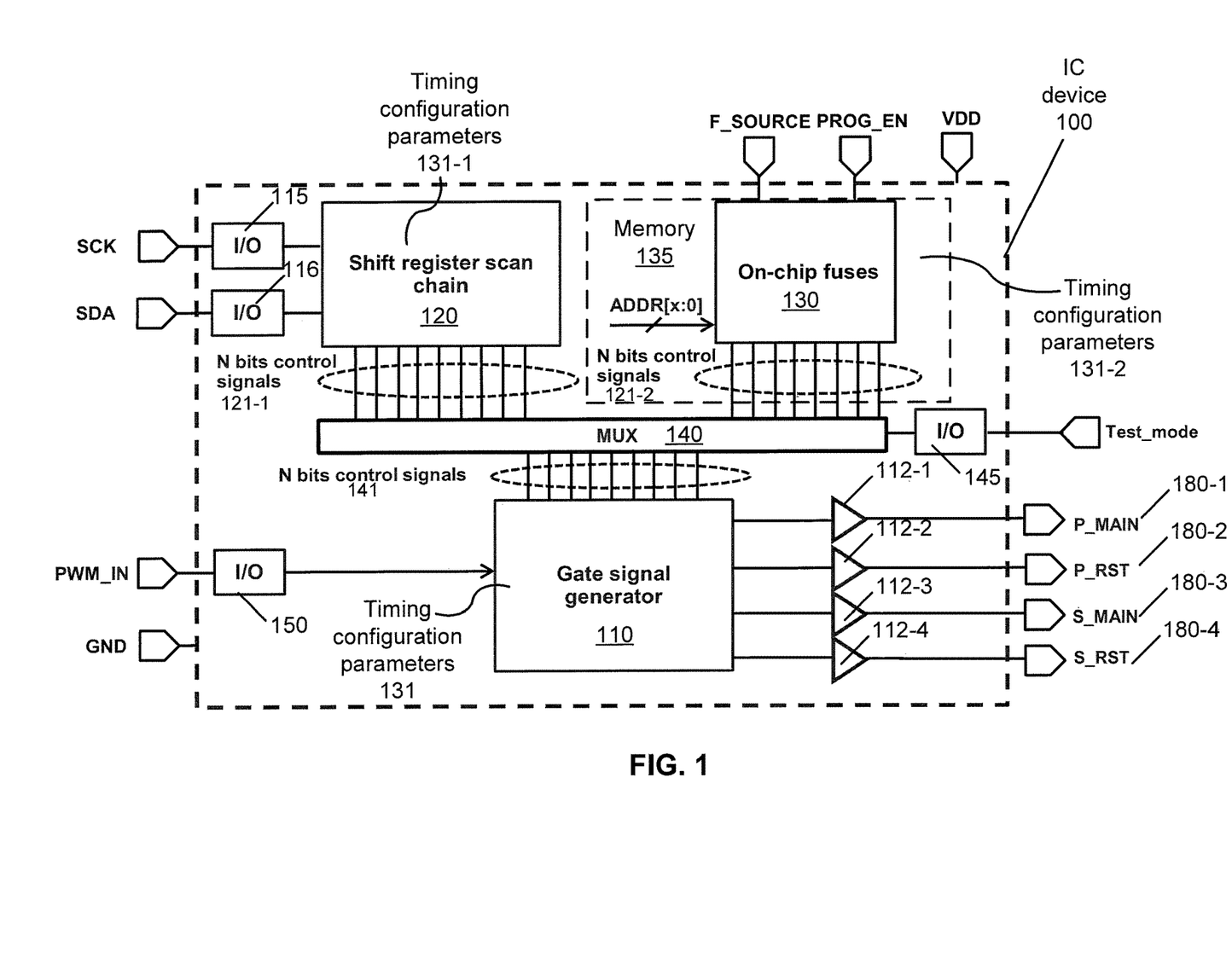
FIG. 1 shows a block diagram of one exemplary embodiment of a proposed integrated circuit (IC) device that provides gate signals for up to four FET gates.
Figure 6:
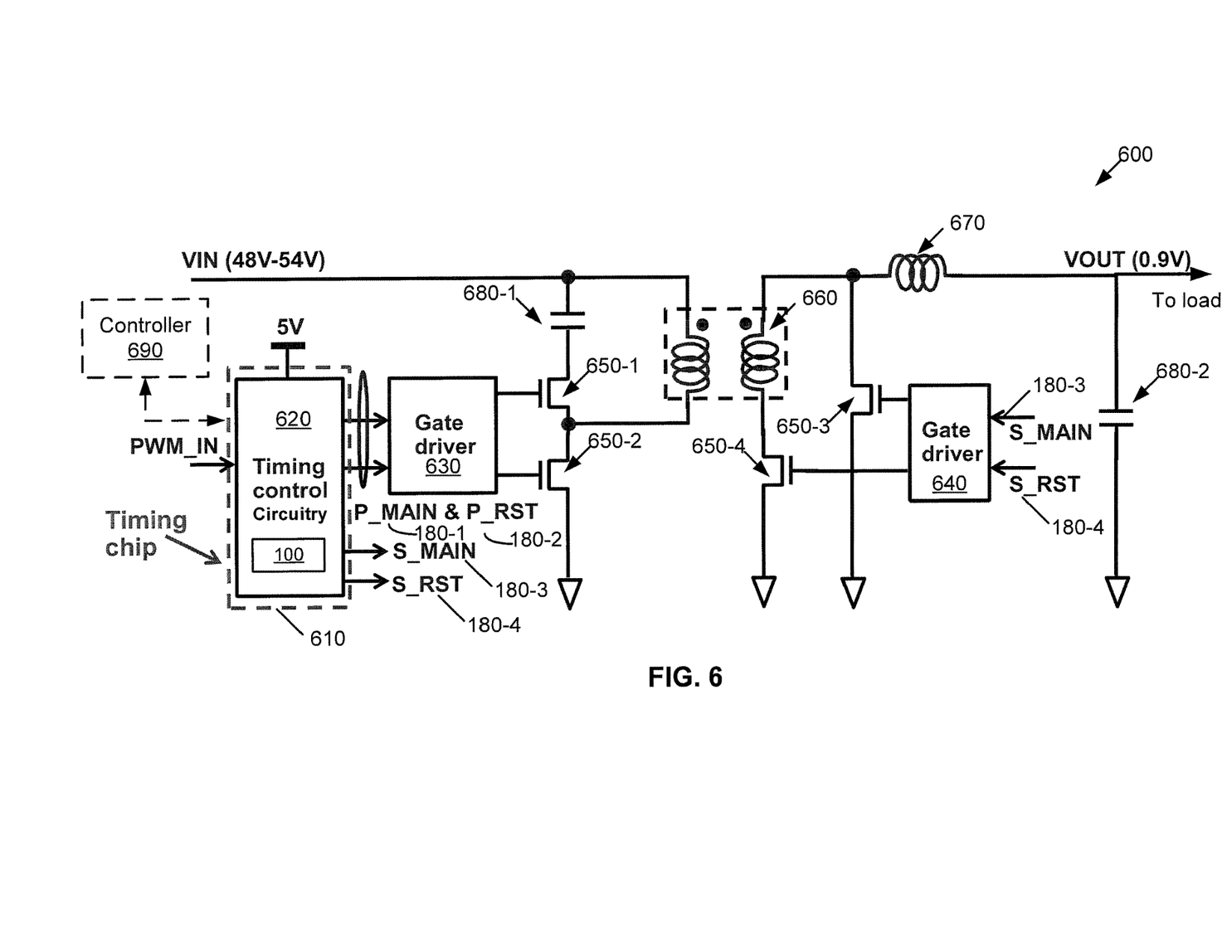
FIG. 6 shows one exemplary implementation of the integrated circuit device from FIG. 1 in a forward power converter, in an exemplary embodiment.

Turning to FIG. 1, this figure shows a block diagram of one exemplary embodiment of a proposed integrated circuit (IC) device 100 that provides gate signals for up to four FET gates from a single input clock signal. The IC device 100 is assumed to be a semiconductor device such as a discrete "chip" or a packaged version thereof, although other devices (e.g., made of discrete components) are possible. The IC device 100 may form part of timing control circuitry for a forward power converter, e.g., as illustrated in FIG. 6. The IC device 100 in this exemplary embodiment comprises a gate signal generator 110, a shift register scan chain 120, a memory 135 comprising in this example on-chip fuses 130, a multiplexer (MUX) 140, multiple I/O (input/output) devices 115, 116, 145, and 150, and multiple output buffers 112-1, 112-2, 112-3, and 112-4. VDD is an input voltage, and GND is the ground. Elements not introduced here are described below.

The gate signal generator 110 comprises circuitry (see, e.g., FIG. 2) that produces four gate signals 180 from a single PWM_IN signal: P_MAIN 180-1; P_RST 180-2; S_MAIN 180-3; and S_RST 180-4. The "P" stands for primary, the "S" for secondary, and the "RST" for reset. Two additional signals (not shown in FIG. 1) that help control timing of these four gate signals 180 are also described below. The PWM_IN is a pulse-width modulation (PWM) clock signal that is input to the gate signal generator 110 after passing through the I/O device 150. There are multiple output buffers 112-1, 112-2, 112-3, and 112-4 corresponding to the respective gate signals P_MAIN 180-1, P_RST 180-2, S_MAIN 180-3, and S_RST 180-4. The gate signal generator 110 can use N bits of control signals 141 as input to determine timing of the gate signals 180. The N bits of control signals 141 may be configured via one of the timing configuration parameters 131-1 or 131-2. These concepts are described in more detail below.

The shift register scan chain 120 takes as input a serial clock (SCK) and serial data (SCA) through respective I/O devices 115 and 116, and creates N bits of parallel control signals 121-1 as input to the MUX 140 and as output from the MUX 140 as N bits of control signals 141. Thus, serial data may be converted to parallel data used to control the gate signal generator 110. The shift register scan chain 120 can be one way of inputting timing configuration parameters 131-1 into the IC device 100.

The MUX 140 has additional inputs of N bits of control signals 121-1 from the memory 135. In one example, the memory 135 comprises the on-chip fuses 130. The memory 135 stores timing configuration parameters 131-2, typically in a nonvolatile fashion (meaning the timing configuration parameters are maintained even when power is off to the IC device 100). The on-chip fuses 130 are programmed using the F_SOURCE and PROG_EN inputs. F_SOURCE is the power source for blowing the fuses 130, and PROG_EN is enable pin for blowing the fuses 130. Another input to the on-chip fuses 130 is the (x+1)-bit address of ADDR[x:0], which allows individual ones (or sets of) of the on-chip fuses 130 to be programmed. As described in reference to FIGS. 3 and 4 and as an example, for a 16 bit input, one bit could be active, and this bit would determine the delay applied to a respective one of the gate signals 180. Typically, the on-chip fuses 130 are blown (e.g., very high/infinite resistance) after programming (or maintain a short if not programmed), meaning they cannot be reset after being blown, but these could also be electrically settable fuses, which can be reset. The memory 135 may also be Electrically Erasable Programmable Read-Only Memory (EEPROM).

The shift register scan chain 120 outputs N bits of control signals 121-1, the on-chip fuses 130 outputs N bits of control signals 121-2. The MUX 140 determines whether either N bits of control signals 121-1 or N bits of control signals 121-2 goes to the N bits of control signals 141. And then N bits of control signals 141 are used by the gate signal generator 110.

One reason for MUX 140 is that the timing configuration parameters 131 can be either stored internally to the IC device 100 (as timing configuration parameters 131-2), or be stored externally to the IC device 100 and loaded into the device (as timing configuration parameters 131-1). The timing configuration parameters 131 used by the gate signal generator 110 are one of the timing configuration parameters 131-1 (stored externally to the device 100) or timing configuration parameters 131-2 (stored internally to the device) 100.

That is, the timing configuration parameters 131 are generally stored internally to the apparatus, as illustrated in FIG. 1 by the timing configuration parameters 131-2 in the memory 135. However, the timing configuration parameters 131 may also be stored externally to the IC device 100 (or a device using the same) and be loaded into the gate signal generator 110 from the timing configuration parameters 131-1, e.g., on startup. The timing configuration parameters 131 may also be stored in a volatile fashion, such as being loaded into the gate signal generator 110 on each startup of the gate signal generator 110. It is further noted that the MUX 140 could be a device that allows the timing configuration parameters 131-1 to be input to the (e.g., non-volatile) memory 135 as timing configuration parameters 131-2, which would then be used by the IC device 100, e.g., until modified.

The wherein timing configuration parameters 131 may also be set through a serial-to-parallel interface as described above with respect to the shift register scan chain 120.

There is also an option of a test mode, implemented using the Test_mode signal through the I/O device 145. This mode is described in more detail in reference to FIG. 7.

Figure 2:
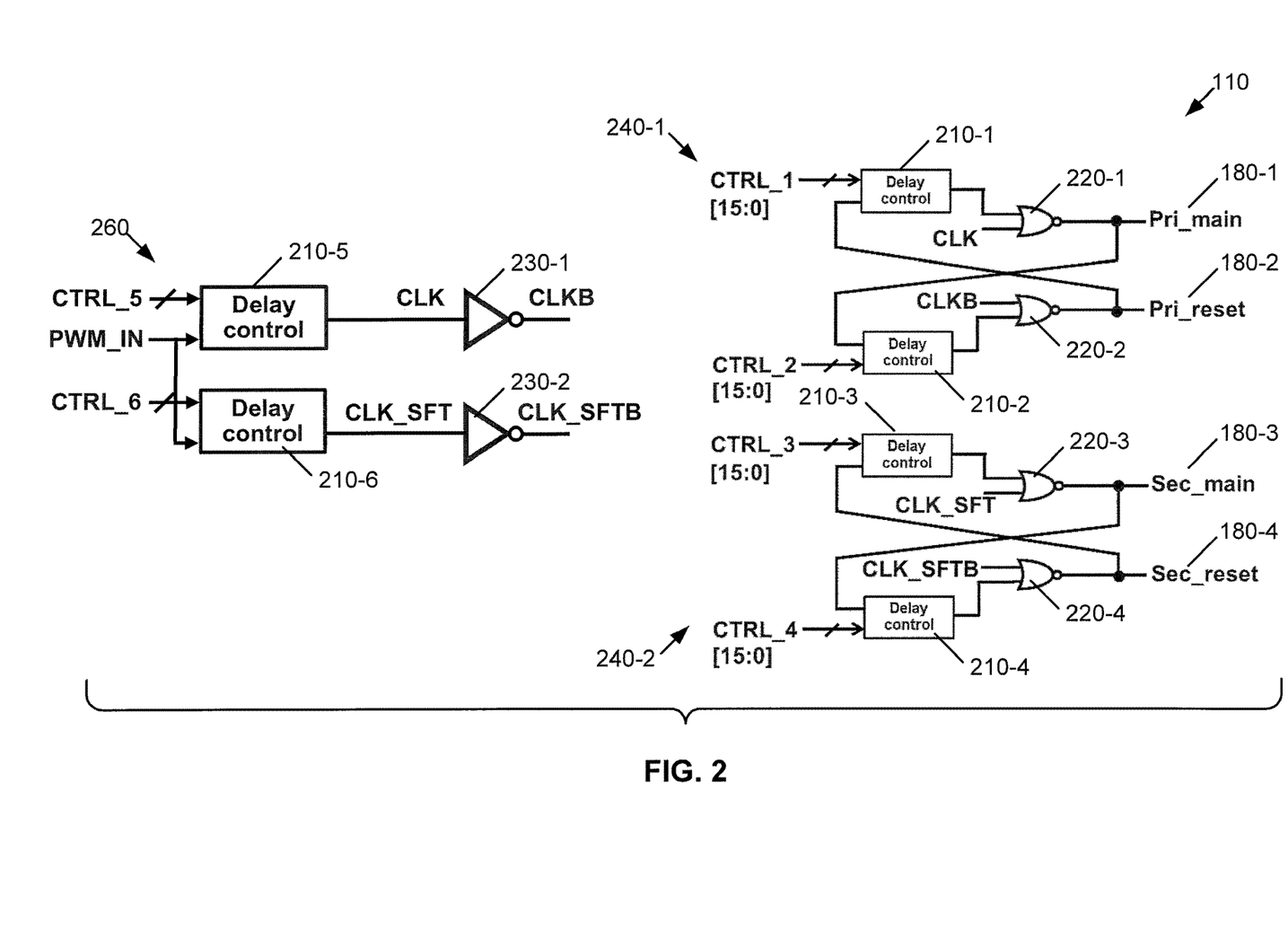
FIG. 2 shows one exemplary embodiment of the gate signal generator from FIG. 1, in an exemplary embodiment.

Turning to FIG. 2, this figure shows one exemplary embodiment of the gate signal generator 110 from FIG. 1. For clarification, these signals are the same between FIGS. 1 and 2: the Pri_main signal is the same signal as the P_MAIN signal; the Pri_reset signal is the same signal as the P-RST signal; the Sec_main signal is the same signal as the S_MAIN signal; and the Sec_reset signal is the same signal as the S_RST signal.

Figure 3:
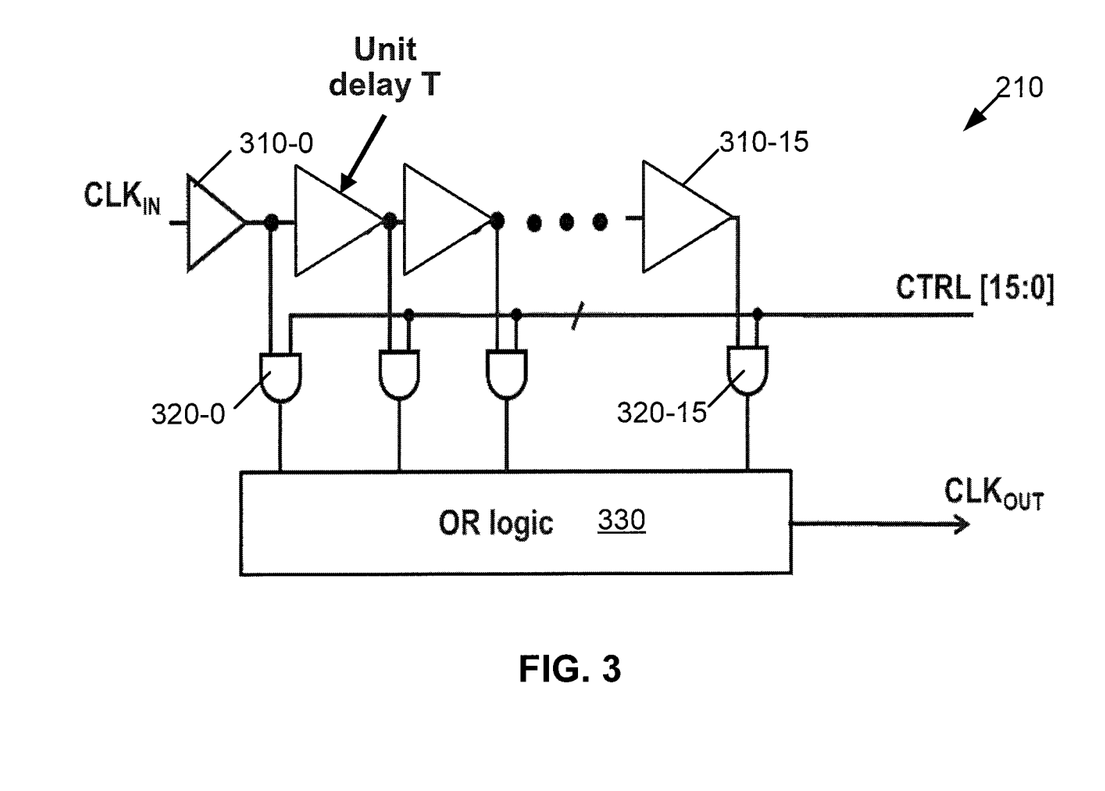
FIG. 3 shows an exemplary delay control circuit from FIG. 2, in an exemplary embodiment.

The Pri_main signal 180-1 and the Pre_reset signal 180-2 are created via the gate signal generation circuitry 240-1, which comprises delay control circuits 210-1 and 210-2 and NOR gates 220-1, 220-2. The CTRL_1 control signals are a set of 16 bits (in this example) and correspond to a timing configuration parameter 131 from the MUX 140. Similarly, the CTRL_2 control signals are a set of 16 bits (in this example) and correspond to another a timing configuration parameter 131 from the MUX 140. The term CTRL means "control", as these are control signals, e.g., for delay. A possible delay control circuitry 220 is illustrated in FIG. 3, described below. The clock signal CLK is input to the NOR gate 220-1, and the clock signal CLKB is input to the NOR gate 220-2. The CLK and CLKB signals are generated by clock generation circuitry 260. The Pri_Main signal 180-1 and Pri_reset signal 180-2 are fed back to respective delay control circuits 210-1 and 210-2.

The Sec_main signal 180-3 and the Sec_reset signal 180-4 are created via the gate signal generation circuitry 240-2, which comprises delay control circuits 210-3 and 210-4 and NOR gates 220-3, 220-4. The CTRL_3 control signals are a set of 16 bits (in this example) and correspond to a timing configuration parameter 131 from the MUX 140. Similarly, the CTRL_4 control signals are a set of 16 bits (in this example) and correspond to another a timing configuration parameter 131 from the MUX 140. The clock signal CLK_SFT is input to the NOR gate 220-3, and the clock signal CLK_SFTB is input to the NOR gate 220-4. The CLK_SFT and CLK_SFTB signals are generated by clock generation circuitry 260. The Sec_Main signal 180-3 and Sec_reset signal 180-4 are fed back to respective delay control circuits 210-3 and 210-4.

The clock generation circuitry 260 provides additional control for the timing of the gate signals 180. The clock generation circuitry 260 comprises a CTRL_5 set of signals that is input along with the PWM_IN signal into a delay control circuit 210-5, and a CTRL_6 set of signals that is input along with the PWM_IN signal into a delay control circuit 210-6. In the examples of FIGS. 2 and 3, the CTRL_5 and CTRL_6 have 16 bits and correspond to respective timing configuration parameters 131. Output of the delay control circuit 210-5 is the CLK signal, which is inverted by inverter 230-1 to produce the CLKB signal. The CLK signal and the CLKB signal are used in gate signal generation circuitry 240-1. Output of the delay control circuit 210-6 is the CLK_SFT signal, which is inverted by inverter 230-2 to produce the CLK_SFTB signal. The CLK_SFT signal and the CLK_SFTB signal are used in gate signal generation circuitry 240-2.

It should be noted that two gate signals such as signals 180-1 and 180-2 may be used instead of four gate signals, and the clock generation circuitry 260 would be modified to support this by removing the delay control circuit 210-6 and the inverter 230-2. Another gate signal generation circuitry 240 could be added, as could another delay control circuit 210 and inverter 230 in the clock generation circuitry 260 (to provide two additional clocks), and this would provide for six gate signals 180. Also, the number of bits for the CTRL signals and the timing configuration parameters 131 are assumed to be 16 bits herein, but this is merely exemplary and other numbers of bits might be used.

Referring to FIG. 3, this figure shows an exemplary delay control circuit 210 from FIG. 2. The delay control circuit 210 comprises 16 delays 310-0 through 310-15, 16 AND gates 320-0 through 320-15, and OR logic 330. The delay is applied to the $CLK_{IN}$ signal. One of the 16 bits in CTRL [15.0] is active at a time and this controls the amount of delay. Note that a bit is also a signal in this example and the CTRL [15:0] acts as an address. The OR logic 330 then selects the output signal 325-1 through 325-15 that is active to create the $CLK_{OUT}$ signal. Note also that the first delay 310-0 has a smaller value (e.g., 1.4 nanoseconds, ns) of delay than the values (4.5 ns) of the other delays 310-1 through 310-15, although this is exemplary. This is to allow the minimum selectable delay to be small, compared to the regular steps (e.g., 4.5 ns) between selectable delays.

Consider the following examples. If the CTRL [0] signal is active and the rest of the signals in CTRL [15:1] are inactive, there would be a single (e.g., minimum) delay caused by delay 310-0. If the CTRL [15] signal is active and the rest of the signals in CTRL [14:0] are inactive, there would be a maximum delay caused by delays 310-0 through 310-15.

Figure 4:
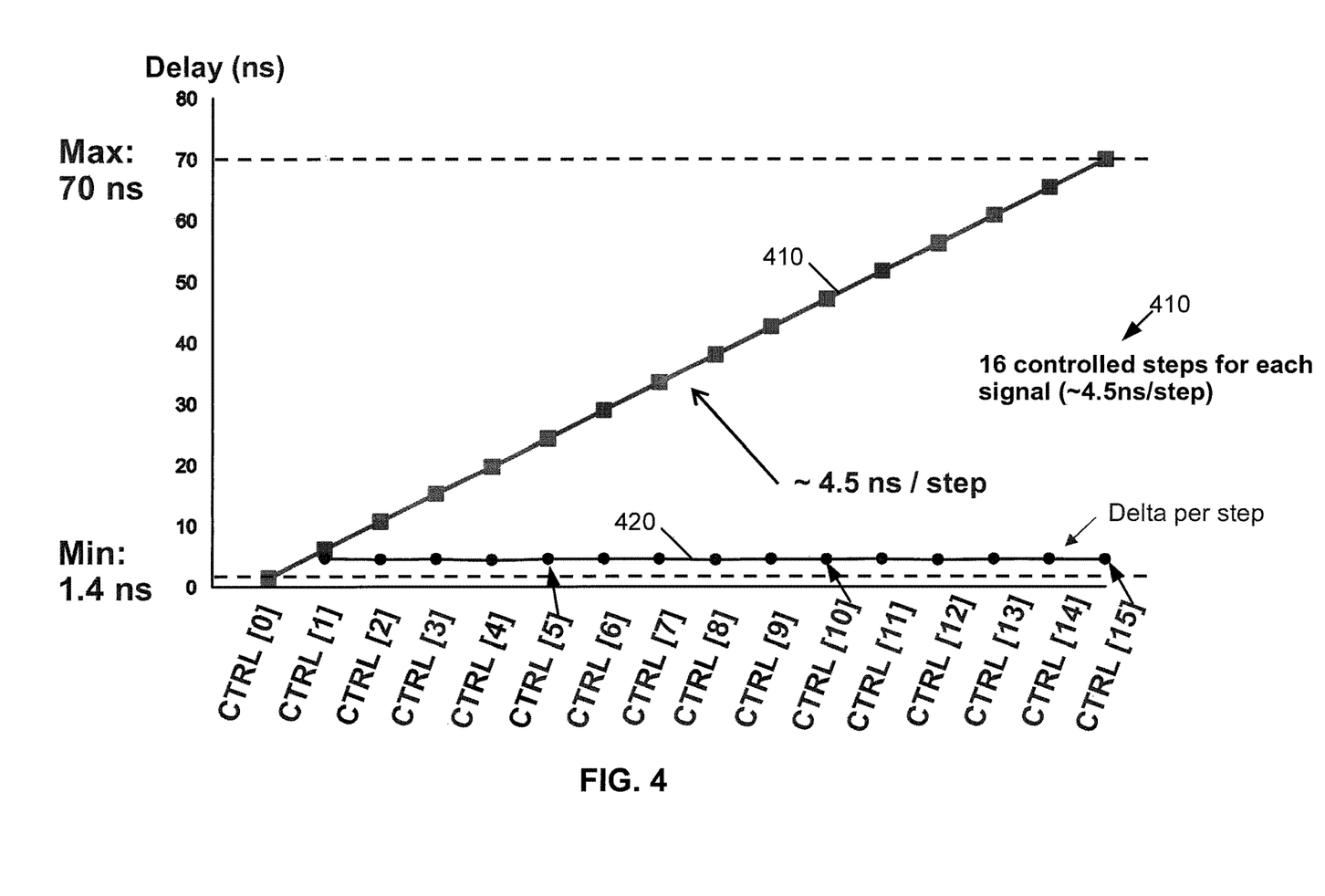
FIG. 4 shows a simulation result of the delay control circuit of FIG. 3, in an exemplary embodiment.

FIG. 4 shows a simulation result of the delay control circuit of FIG. 3. On the vertical axis, the delay in nanoseconds (ns) is shown, from a minimum (min) of 1.4 ns to a maximum (max) of 70 ns in this example. There are (as illustrated by reference 410) 16 controlled steps for each signal, with about 4.5 ns per step (~4.5 ns/step), and the total delay is indicated by line 410. Line 420 indicates the amount of delta per step, e.g., 4.5 ns per step for each of the control bits.

Figure 5:
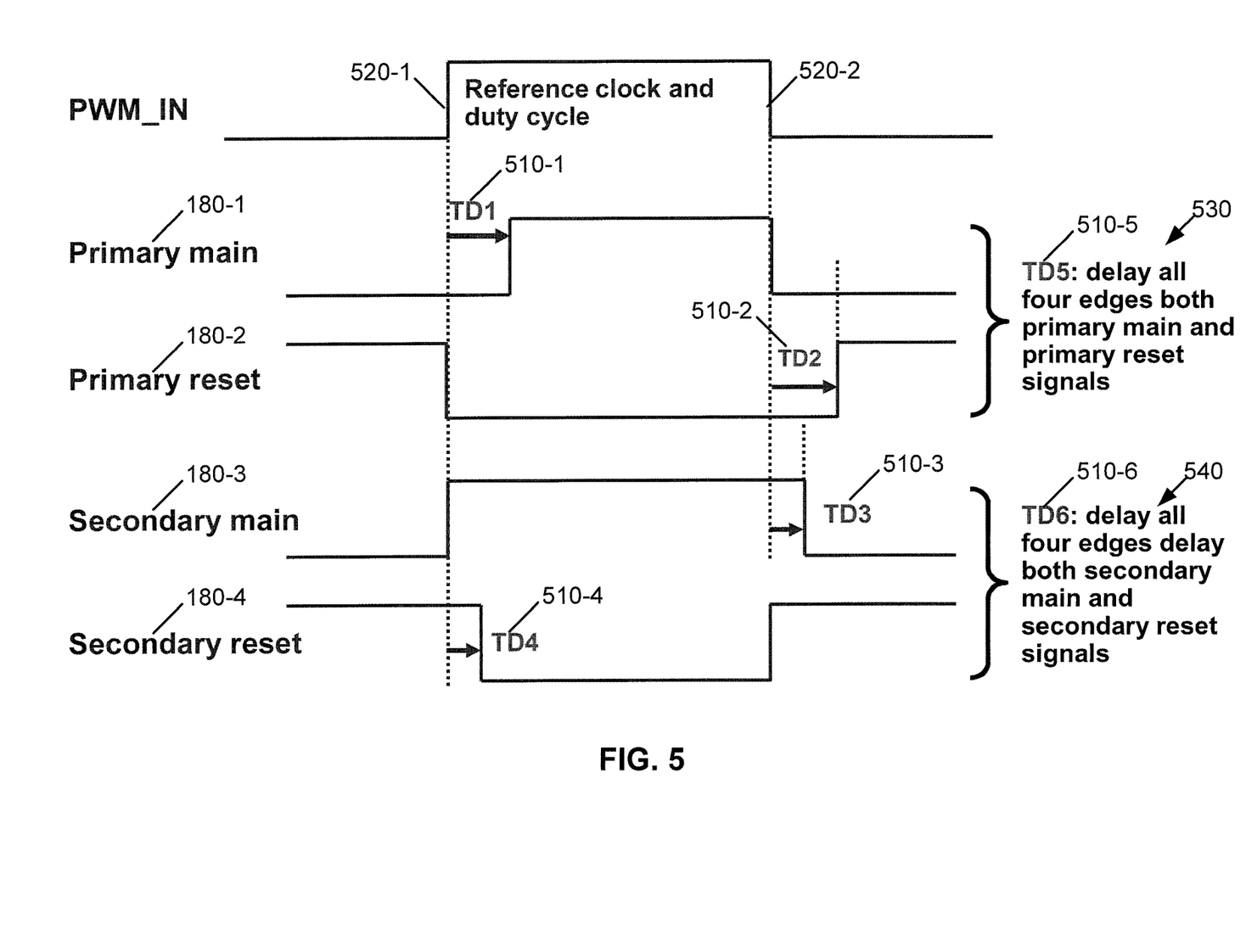
FIG. 5 shows a timing diagram of clock signals that shows exemplary relative timings (via waveforms) of P_MAIN, P_RST, S_MAIN, and S_RST.

Turning to FIG. 5, this figure shows a timing diagram of clock signals that shows exemplary relative timings (via waveforms) of P_MAIN 180-1 (shown as Primary main), P_RST 180-2 (shown as Primary reset), S_MAIN 180-3 (shown as Secondary main), and S_RST 180-4 (shown as Secondary reset). The PWM_IN signal is shown with a rising edge 520-1 and a falling edge 520-2, and the timing is shown relative to these edges. The PWM_IN signal is the reference clock and part of its duty cycle is shown.

Multiple time delays (TDs) 510 are illustrated. Each of the multiple TDs 510 is configured at least by a corresponding one of the timing configuration parameters 131. TD1 510-1 is a time delay created in part by the delay control circuit 210-1 based on the CTRL_1 signal, TD2 510-2 is a time delay created in part by the delay control circuit 210-2 based on the CTRL_2 signal, TD3 510-3 is a time delay created in part by the delay control circuit 210-3 based on the CTRL_3 signal, and TD4 510-4 is a time delay created in part by the delay control circuit 2104 based on the CTRL_4 signal. TD5 510-5 is a time delay created by the delay control circuit 210-5 based on the CTRL_5 signal, and TD5 510-5 will delay (see reference 530) all four edges of both the Primary main signal 180-1 and the Primary reset signal 180-2. TD6 510-6 is a time delay created by the delay control circuit 210-6 based on the CTRL_6 signal, and TD5 510-6 will delay (see reference 540) all four edges of both the Secondary main signal 180-3 and the Secondary reset signal 180-4.

FIG. 5 illustrates that the time delays 510 are positive, meaning they are relative to the rising edge 520-1 or the falling edge 520-2 of the PWM_IN and cause edges for gate signals 180 that occur later in time than the edge(s) 520-1 and/or 520-2. It is possible to have positive deadtime (510-1 and 510-2) between two gate signals (180-1 and 180-2). It may also be possible to have negative deadtime (510-3 and 510-4) between two gate signals (180-3 and 180-4).

Turning to FIG. 6, this figure shows one exemplary implementation of the integrated circuit device 100 from FIG. 1 in a forward power converter 600. The forward power converter 600 comprises a timing chip 610 (e.g., a packaged IC) comprising timing control circuitry 620, which itself comprises the IC device 100. The timing control circuitry 620 has an input of 5 volts (5V) and the PWM_IN signal and outputs the gate signals 180-1 through 180-4. The P_MAIN signal 180-1 and P_RST signal 180-2 are inputs to gate driver 630, which uses these signals to drive corresponding FETs 650-1 and 650-2. On the left side of the diagram, the VIN is between 48 and 54 volts, there is a capacitor 680-1, and this side powers part of a transformer 660. The forward power converter 600 converts the 48 to 54 volts to VOUT of 0.9 volts. The right side of the figure contains an inductor 670 and another capacitor 680-2. The two FETs 650-3 and 650-4 are driven by gate driver 640, which has inputs of the gate signals S_MAIN 180-3 and S_RST 180-4. The VOUT may be used to power a load (not shown).

The forward power converter 600 may include or be connected to a controller 690. The controller 690 may be used to test and set up the timing configuration parameters 131 and perform other functions. Typically, this is performed in a manufacturing process when the forward power converter 600 is first implemented, and the results of determining the timing configuration parameters 131 are applied to this and other forward power converters 600 having the same configuration. For instance, in FIG. 7 described below, a test board containing all elements of the forward power converter 600 is used to determine the timing configuration parameters 131 (and other parameters, if desired), and these parameters are applied to other boards having the same configuration. It is also possible, depending on implementation, to use the controller 690 periodically during lifetime of the forward power converter 600, such as by integrating the controller 690 into the forward power converter 600 or leaving the controller 690 separate from but connectable or connected to the forward power converter 600.

Figure 7:
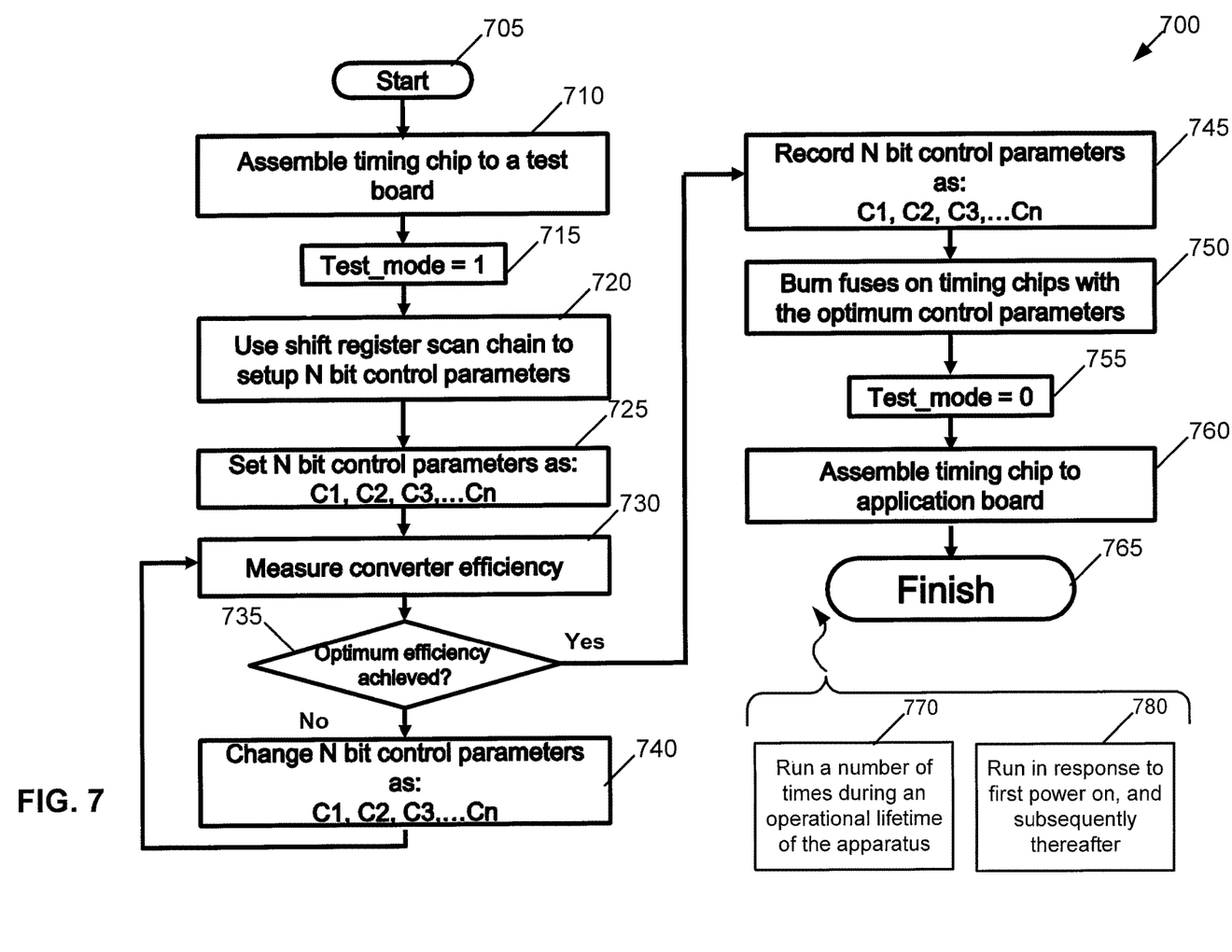
FIG. 7 is a flowchart of an exemplary method for optimization to determine timing parameters for the exemplary forward power converter of FIG. 6, in an exemplary embodiment.

Referring to FIG. 7, this figure is a flowchart of an exemplary method for optimization to determine timing parameters for the exemplary forward power converter 600 of FIG. 6. FIG. 7 illustrates the operation of an exemplary method or methods, a result of execution of computer program instructions embodied on a computer readable memory, functions performed by logic implemented in hardware, and/or interconnected means for performing functions in accordance with exemplary embodiments. The method 700 starts in block 705, and in block 710, the timing chip 610 is assembled to a test board. In block 715, the test_mode signal (see FIG. 1) is activated (e.g., set to one (1)), e.g., using the controller 690, potentially under control of a human operator. In block 720, the shift register scan chain 120 is used to set up the N bit control parameters (e.g., the timing configuration parameters 131). Note that the engineers designing the forward power converter 600 have an idea of initial values for these parameters and will configure the controller 690 to set the appropriate parameters. In block 725, the N bit control parameters are set as C1, C2, C3, . . . , Cn. For instance, in FIG. 6, there were six control signals, CTRL_1, CRTL_2, . . . , CTRL_6, and these can be set in block 725. The flow for method 700 is therefore for all the time delays.

It is noted that, based on each control signal being 16 bits, then the N bit control parameters in FIG. 7 would be 6×16=96 bits. Similarly, the N bits of control signal 121-1, 121-2, and 141 from FIG. 1 could also be 96 bits. The timing configuration parameters 131 may also include these 96 bits. Note that the number of control signals, control bits, and timing configuration parameters is merely exemplary.

In block 730, the converter efficiency is measured, e.g., by the controller 690. This may be performed by measuring input voltage, input current, output voltage and output current of the converter. Then efficiency is calculated as: efficiency=(output voltage×output current)/(input voltage× input current). In block 635, it is determined if the optimum efficiency has been achieved. This may be determined through any number of algorithms, such as steepest descent algorithms. Regardless of which algorithm is used, at some point a decision is made that the optimum efficiency has been achieved for the particular algorithm in use. For instance, the algorithm could reach a point where a threshold is reached. If the optimum efficiency has not been achieved (block 735=No), in block 740, the N bits of control parameters are modified as C1, C2, C3, . . . , Cn and flow proceeds to block 725.

By contrast, if the optimum efficiency has been achieved (block 735=Yes), in block 745, the N bits of control parameters are recorded as C1, C2, C3, . . . , Cn. Note that these define the timing configuration parameters 131. In block 750, the fuses in the on-chip fuses 130 are burnt with the optimum control parameters (e.g., as defined by the timing configuration parameters 131 that result). This example uses fuses in on-chip fuses 130 that are burnt once, but other implementations such as using electrically settable fuses are possible.

The test mode signal is inactivated (e.g., set to zero (0)) in block 755. In block 760, the timing chip 610, with its integrated and configured IC device 100, is assembled to an application board having a forward power converter 600 of the same configuration in the test board. The method 700 ends in block 765.

The method 700 might be run for a single board, and then the parameters applied to other boards having the same hardware configuration. As another example, illustrated by block 770, the method 700 may be run a number of times during an operational lifetime of the apparatus, e.g., the IC device 100 and possibly any connected devices. For instance, the method 700 may be run in response to first power on, and subsequently thereafter, e.g., at a subsequent power on. The N bit control parameters could be set via a scan chain or other input technique. The timing configuration parameters 131 could be replaced with each run of method 700.

A computer program product could be used to control some of this functionality, such as the controller 690.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus, comprising:
   a semiconductor device to control a power converter having two or more power field effect transistors (FETs), comprising the following:
   a gate signal generator configured to produce two or more gate signals able to drive the two or more FETs, the gate signal generator with programmable timing configuration parameters to control operation of the two or more gate signals, wherein the timing configuration parameters are digitally programmed via a memory in the semiconductor device, and the timing configuration parameters control one or more delay control circuits to adjust timing of the two or more gate signals, wherein at least one delay control circuit comprises a series of unit delays that delay an input clock signal and circuitry configured to select an output of one of the unit delays based on a value of a corresponding timing configuration parameter.

2. The apparatus of claim 1, wherein the memory comprises a nonvolatile memory and wherein the timing configuration parameters are stored in the nonvolatile memory.

3. The apparatus of claim 2, wherein the nonvolatile memory is implemented with fuses that are burnt after programming or maintain a short if not programmed.

4. The apparatus of claim 2, wherein the nonvolatile memory is implemented with electrically settable fuses.

5. The apparatus of claim 2, wherein the nonvolatile storage is implemented with Electrically Erasable Programmable Read-Only Memory.

6. The apparatus of claim 2, wherein the timing configuration parameters are stored internally to the semiconductor device in the memory.

7. The apparatus of claim 2, wherein the timing configuration parameters are stored externally to the gate signal generator and are loaded into the apparatus in response to powering on the gate signal generator.

8. The apparatus of claim 1, wherein the memory comprises a volatile memory and wherein the timing configuration parameters are stored in the volatile memory.

9. The apparatus of claim 1, wherein the gate signal generator comprises first gate signal generation circuitry generating two of the two or more gate signals, the first gate signal generation circuitry comprising:
   a first delay control circuit having a first N bit control input that is digitally programmed via the memory, a clock input, and an output;
   a first NOR gate having a first clock input and an input coupled to the output of the first delay control circuit, and an output of a first gate signal of the two or more gate signals;
   a second delay control circuit having a second N bit control input that is digitally programmed via the memory, a clock input, and an output; and
   a second NOR gate having a second clock input and an input coupled to the output of the second delay control circuit, and an output of a second gate signal of the two or more gate signals,
   wherein the first clock input is connected to a first clock signal and the second clock input is connected to a second clock signal that is an inverse of the clock signal, wherein the first gate signal is connected to the clock input of the second delay control circuit, and wherein the second gate signal is connected to the clock input of the first delay control circuit.

10. The apparatus of claim 9, wherein the two or more gate signals comprise four gate signals, wherein the gate signal generator comprises second gate signal generation circuitry generating two of the four gate signals, the second gate signal generation circuitry comprising:
   a third delay control circuit having a third N bit control input that is digitally programmed via the memory, a third clock input, and an output;
   a third NOR gate having a clock input and an input coupled to the output of the third delay control circuit, and an output of a third gate signal of the two or more gate signals;

a fourth delay control circuit having a fourth N bit control input that is digitally programmed via the memory, a clock input, and an output;

a fourth NOR gate having a fourth clock input and an input coupled to the output of the fourth delay control circuit, and an output of a fourth gate signal of the two or more gate signals, wherein the third clock input is connected to a third clock signal and the fourth clock input is connected to a fourth clock signal that is an inverse of the third clock signal, wherein the third gate signal is connected to the clock input of the fourth delay control circuit, and wherein the fourth gate signal is connected to the clock input of the third delay control circuit.

11. The apparatus of claim 10, wherein the gate signal generator comprises clock generation circuitry configured to output the first, second, third, and fourth clock signals, and wherein the clock generation circuitry has a delay control circuit that is digitally programmed via the memory and configured to delay the first and second clock signals and a delay control circuit that is digitally programmed via the memory and configured to delay the third and fourth clock signals.

12. The apparatus of claim 1, further comprising the power converter, wherein the power converter is coupled to the semiconductor device and to the two or more gate signals.

13. An apparatus, comprising:
a semiconductor device to control a power converter having two or more power field effect transistors (FETs), comprising the following:
a gate signal generator configured to produce two or more gate signals able to drive the two or more FETs, the gate signal generator with programmable timing configuration parameters to control operation of the two or more gate signals, wherein the timing configuration parameters are digitally programmed via a memory in the semiconductor device, wherein:
the apparatus comprises a serial-to-parallel interface and a multiplexor,
the serial-to-parallel interface is connected to a first input of a multiplexor;
a second input of the multiplexor is connected to the memory;
the gate signal generator has a parallel input, and an output of the multiplexor is connected to the parallel input of the gate signal generator, the timing configuration parameters are set through the serial-to-parallel interface, through the first input and the output of the multiplexor to the parallel input the gate signal generator, or are set from the memory, through the second input and the output of the multiplexor, and into the parallel input of the gate signal generator.

14. An apparatus, comprising:
a semiconductor device to control a power converter having two or more power field effect transistors (FETs), comprising the following:
a gate signal generator configured to produce two or more gate signals able to drive the two or more FETs, the gate signal generator with programmable timing configuration parameters to control operation of the two or more gate signals, wherein the timing configuration parameters are digitally programmed via a memory in the semiconductor device; and
a controller configured to cause the apparatus to perform an optimization process to determine the timing configuration parameters, wherein the timing configuration parameters are considered based on the optimization process to be optimal for the power converter.

15. The apparatus of claim 14, wherein the optimization process is run a number of times during an operational lifetime of the apparatus.

16. The apparatus of claim 14, wherein the memory comprises a nonvolatile memory and results of the optimization process are stored in the nonvolatile memory as the timing configuration parameters.

17. The apparatus of claim 15, wherein the optimization process is run multiple times per power on of the apparatus and is run during operation of the apparatus.

18. The apparatus of claim 15, wherein the optimization process is run every time the apparatus is powered on.

19. The apparatus of claim 14, wherein results of the optimization process are stored in the memory as one of a volatile memory or a non-volatile memory as the timing configuration parameters.

20. The apparatus of claim 15, wherein a first optimization process is run in response to initial power on of the apparatus and results of the first optimization process are stored in the memory as non-volatile memory as the timing configuration parameters, and wherein a second optimization process is run for a subsequent operation of the apparatus and results of the second optimization process are stored in non-volatile memory as the timing configuration parameters.

* * * * *